US010432256B2

(12) United States Patent
Stikeleather et al.

(10) Patent No.: US 10,432,256 B2
(45) Date of Patent: Oct. 1, 2019

(54) SYSTEM FOR REDUCING CROSSTALK AND RETURN LOSS WITHIN ELECTRICAL COMMUNICATION CONNECTORS

(71) Applicant: Optical Cable Corporation, Roanoke, VA (US)

(72) Inventors: Derrick F. Stikeleather, Black Mountain, NC (US); John Michael Ray, Franklinton, NC (US); Ian J. Timmins, Asheville, NC (US)

(73) Assignee: Optical Cable Corporation, Roanoke, VA (US)

( * ) Notice: Subject to any disclaimer, the term of this patent is extended or adjusted under 35 U.S.C. 154(b) by 0 days.

(21) Appl. No.: 15/659,275

(22) Filed: Jul. 25, 2017

(65) Prior Publication Data

US 2018/0026676 A1    Jan. 25, 2018

Related U.S. Application Data

(60) Provisional application No. 62/366,446, filed on Jul. 25, 2016.

(51) Int. Cl.
*H04B 3/32* (2006.01)
*H05K 1/02* (2006.01)
(Continued)

(52) U.S. Cl.
CPC ............ *H04B 3/32* (2013.01); *H01R 13/6466* (2013.01); *H01R 13/6467* (2013.01); *H01R 24/64* (2013.01); *H05K 1/0228* (2013.01); *H05K 2201/09236* (2013.01); *H05K 2201/09245* (2013.01); *H05K 2201/10189* (2013.01)

(58) Field of Classification Search
CPC ...... H04B 3/32; H01R 13/6466; H01R 24/64; H01R 13/6467; H01R 13/6658; H05K 1/0228; H05K 2201/10189; H05K 2201/09236; H05K 2201/09245
USPC ......... 439/676, 620.09, 620.13, 620.14, 941, 439/620.22
See application file for complete search history.

(56) References Cited

U.S. PATENT DOCUMENTS

4,418,324 A * 11/1983 Higgins .............. H01P 1/20336
                                                                   333/204
RE31,470 E * 12/1983 Bedard ................... H01P 1/205
                                                                   333/203
(Continued)

*Primary Examiner* — Travis S Chambers
(74) *Attorney, Agent, or Firm* — The Van Winkle Law Firm; William G. Heedy (57) ABSTRACT

A system that reduces crosstalk and return loss within electrical communication connectors includes at least two compensating capacitors connected in series that compensate each offending capacitor. An additional inductive component that is connected between two compensating capacitors so that the adjustable inductance of the inductive component can be varied to modify the capacitive coupling effect achieved by the compensating capacitors as a function of frequency. A shape-neutral structure containing two compensating capacitors and one series inductive component in between is positioned so that each compensating capacitor is juxtaposed parallel to the offending capacitor. There is no direct contact between the shape-neutral structure and the transmission lines, and the shape-neutral structure does not change the shape of PCB traces and reduces both crosstalk and return loss.

6 Claims, 7 Drawing Sheets

(51) Int. Cl.
*H01R 13/6467* (2011.01)
*H01R 24/64* (2011.01)
*H01R 13/6466* (2011.01)

(56) References Cited

U.S. PATENT DOCUMENTS

| | | | | |
|---|---|---|---|---|
| 5,929,729 | A * | 7/1999 | Swarup | H01P 3/085 333/116 |
| 6,016,084 | A * | 1/2000 | Sugimoto | H03H 7/01 333/12 |
| 8,049,578 | B1 * | 11/2011 | Albers | H01P 1/20345 333/134 |
| 9,209,569 | B2 * | 12/2015 | Schumacher | H01R 13/6466 |
| 9,787,030 | B2 * | 10/2017 | Schumacher | H01R 12/53 |
| 9,825,406 | B2 * | 11/2017 | Patel | H01R 13/6466 |
| 2007/0133182 | A1 * | 6/2007 | Chen | H03H 7/09 361/748 |
| 2008/0268710 | A1 * | 10/2008 | Hashim | H05K 1/0228 439/620.21 |
| 2010/0159752 | A1 * | 6/2010 | Siev | H01R 31/06 439/676 |
| 2012/0052729 | A1 * | 3/2012 | Fite | H01R 13/6658 439/620.09 |
| 2016/0079710 | A1 * | 3/2016 | Schumacher | H01R 13/6466 439/620.21 |
| 2017/0117670 | A1 * | 4/2017 | Schumacher | H01R 12/53 |

\* cited by examiner

SYSTEM FOR REDUCING CROSSTALK AND RETURN LOSS WITHIN ELECTRICAL COMMUNICATION CONNECTORS

RELATED APPLICATION

This application claims priority to and incorporates entirely by reference U.S. Provisional Patent Application Ser. No. 62/366,446 filed on Jul. 25, 2016.

FIELD OF THE INVENTION

This invention relates to RJ telecommunications connectors and, more particularly, a transmission line design of RJ-45 connectors that is shape neutral and reduces electrical signal interference and return loss.

BACKGROUND OF THE INVENTION

The Federal Communications Commission (FCC) has adopted certain architectural standards with respect to electrical connectors utilized in the telecommunication industry so as to provide intermatability. The connectors most commonly utilized are FCC type modular plugs and jacks, also referred to as RJ-45 plugs and jacks. The plug is commonly terminated to a plurality of conductors which may be connected to a communication device. Normally, each plug is terminated to eight conductors which form four pairs. The corresponding jack is commonly mounted to a panel or a printed circuit board (PCB) or a wall outlet, which in turn is connected to the telecommunication network. To complete the circuit, the plug and jack are intermated.

In RJ-45 telecommunication jack design, it is necessary to have a compensating structure that overcomes the noise generated within the plug. The noise is generated due to the coupling between the conductors, known as crosstalk, based on the mutual capacitive and mutual inductive interferences between signal lines. Accordingly, crosstalk can be classified into capacitive crosstalk and inductive crosstalk. As explained in the U.S. Pat. No. 5,299,956, which was assigned to Optical Cable Corporation, assignee of this application, when an electrical signal of a given frequency is applied to a pair of conductors, unequal portions of signal energy is transmitted to the individual conductors of an adjacent pair by each conductor of the signal pair. The capacitive and inductive coupling between adjacent conductors are substantially higher than those couplings of the other conductors of the signal pair. The phenomenon of crosstalk is exaggerated when both conductors of the signal pair are placed adjacent to and outside of opposing conductors of the other signal pair. The extent of the crosstalk depends on the space between the adjacent conductors, the dielectric constant of the material between the adjacent conductors, and the distance in which such conductors are closely spaced and parallel to each other. Further, the extent of the crosstalk is a function of frequency, increasing logarithmically as the frequency of the signal increases.

There are some general design guidelines for reducing crosstalk, for example, placing the conductors after the signal transmission lines exit the modular jack so as to induce signals of opposite phase to those which were induced inside the plug or jack; routing a second signal pair in a pattern that is opposite in polarity to the pattern of the signal pair that produces crosstalk in the plug or jack. However, the addition or rerouting of the signal transmission lines causes impedance mismatch in the transmission system, thereby negatively affecting the structural return loss, voltage standing wave ratio, and combined system attenuation.

In light of the above, there exists a need for a transmission line design for reducing crosstalk without causing higher return loss.

BRIEF SUMMARY OF THE INVENTION

In accordance with one form of this invention, there is provided a system for reducing crosstalk and return loss within electrical communication connectors including at least four of a plurality of pins, wherein a first pin and a second pin constitute a first pair and a third pin and a fourth pin constitute a second pair; at least two of a plurality of offending capacitors, wherein a first offending capacitor is applied between the first pin and the second pin and a second offending capacitor is applied between the third and the fourth pin; and at least four of a plurality of compensating capacitors, wherein a first compensating capacitor and a second compensating capacitor connected in series are applied between the first pin and the third pin and a third compensating capacitor and a fourth compensating capacitor connected in series are applied between the second pin and the fourth pin; wherein at least one of the first and second compensating capacitors has no direct connection to the second pin; and wherein at least one of the third and fourth compensating capacitors has no direct connection to the third pin.

In accordance with another form of this invention, there is provided a system for reducing crosstalk and return loss within electrical communication connectors including at least a shape-neutral structure containing at least one of a plurality of compensating capacitors, wherein the shape-neutral structure has no direct contact with PCB traces.

In accordance with another form of this invention, there is provided a system for reducing crosstalk and return loss within electrical communication connectors including at least four of a plurality of pins, wherein a first pin and a second pin constitute a first pair and a third pin and a fourth pin constitute a second pair; wherein at least four offending capacitors includes a first offending capacitor connected to the first pin; a second offending capacitor connected to the second pin; a third offending capacitor connected to the third pin; and a fourth offending capacitor connected to the fourth pin; and at least four of a plurality of compensating capacitors, wherein each of the plurality of compensating capacitors has almost the same shape and size; wherein a first compensating capacitor is juxtaposed parallel to the first offending capacitor but has no direct contact with the first pin; a second compensating capacitor is juxtaposed parallel to the second offending capacitor but has no direct contact with the second pin; a third compensating capacitor is juxtaposed parallel to the third offending capacitor but has no direct contact with the third pin; and a fourth compensating capacitor is juxtaposed parallel to the fourth offending capacitor but has no direct contact with the fourth pin; and wherein the first compensating capacitor is connected with the third compensating capacitor in series; and the second compensating capacitor is connected with the fourth compensating capacitor in series.

In the present invention, an additional compensating capacitor is connected with a traditional large capacitance compensating capacitor in series for compensating one offending capacitor that generates crosstalk. The additional compensating capacitor is located between the large capacitance compensating capacitor and the contact of the transmission lines. As a result, there is no need of a large physical structure for accommodating the large capacitance compensating capacitor within the electrical connectors. Also, the large capacitance compensating capacitor has no direct contact with the transmission lines so that the shape of the transmission lines remains unchanged. Further, an addition of an inductive component between the two compensating capacitors may modify the capacitive coupling effect achieved by the compensating capacitors as a function of frequency due to its adjustable inductance.

A shape-neutral structure is designed to compensate offending capacitors without direct contact with the PCB traces. The shape-neutral structure may contain two compensating capacitors and an inductive component located in between. The preferred position of the shape-neutral structure is to juxtapose the compensating capacitors of the shape-neutral structure electrically close to and parallel to the offending capacitors. When using plate capacitors, the compensating capacitors may have the same size and shape, without direct contacts with the PCB traces. When the compensating capacitors have no direct contacts with the PCB traces, they do not alter the shape of the transmission lines, and do not cause impedance mismatch. Thus, the shape-neutral structure is used for compensating offending capacitors by reducing both crosstalk and return loss.

BRIEF DESCRIPTION OF THE DRAWINGS

For a fuller understanding of the nature of the present invention, reference should be made to the following detailed description, taken in conjunction with the accompanying drawings in which.

DETAILED DESCRIPTION OF THE PREFERRED EMBODIMENTS

Figure 1:
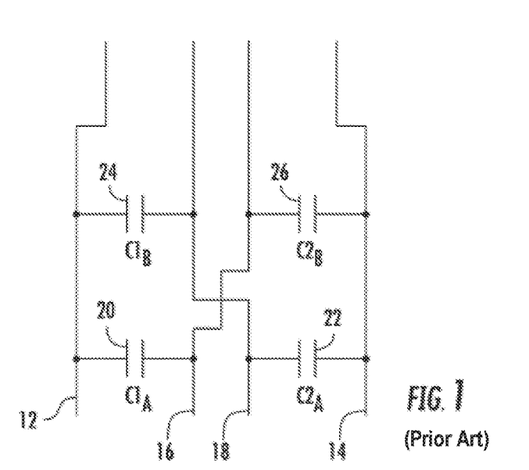
FIG. 1 is a schematic illustration of a typical capacitive compensation implementation.

FIG. 1 shows a typical capacitive compensation implementation (10). There are two pairs of pins within the plug: one is the split pair of Pin 3 (12) and Pin 6 (14), and the other is the middle pair of Pin 4 (16) and Pin 5 (18). The split pair is called Pair 3 and the middle pair is called Pair 1. Two offending capacitors, $C1_A$ (20) and $C2_A$ (22), are applied between Pin 3 (12) and Pin 4 (16) and between Pin 5 (18) and Pin 6 (14), respectively. To compensate the capacitive crosstalk between Pair 1 and Pair 3, another two capacitors, $C1_B$ (24) and $C2_B$ (26) within the jack are applied between Pin 3 (12) and Pin 5 (18) and between Pin 4 (16) and Pin 6 (14), respectively. Since Pair 1 and Pair 3 are in close proximity, the capacitors $C1_B$ (24) and $C2_B$ (26) within the jack must have large capacitances to overcome the crosstalk generated within the plug, and consequently, the large capacitance capacitors require a large physical structure. Further, Pair 3 may crosstalk to other pairs (Pair 2 and Pair 4, not shown in FIG. 1) within the plug, which also needs to be overcome by large capacitance capacitors within the jack. All of these large capacitance capacitors for capacitive compensation have direct contact with or are attached to Pair 3, resulting in a large physical structure within the jack. Due to the direct contact, the large capacitance capacitors may also alter the shape of the transmission lines and cause the impedance mismatch that results in higher return loss.

Figure 2:
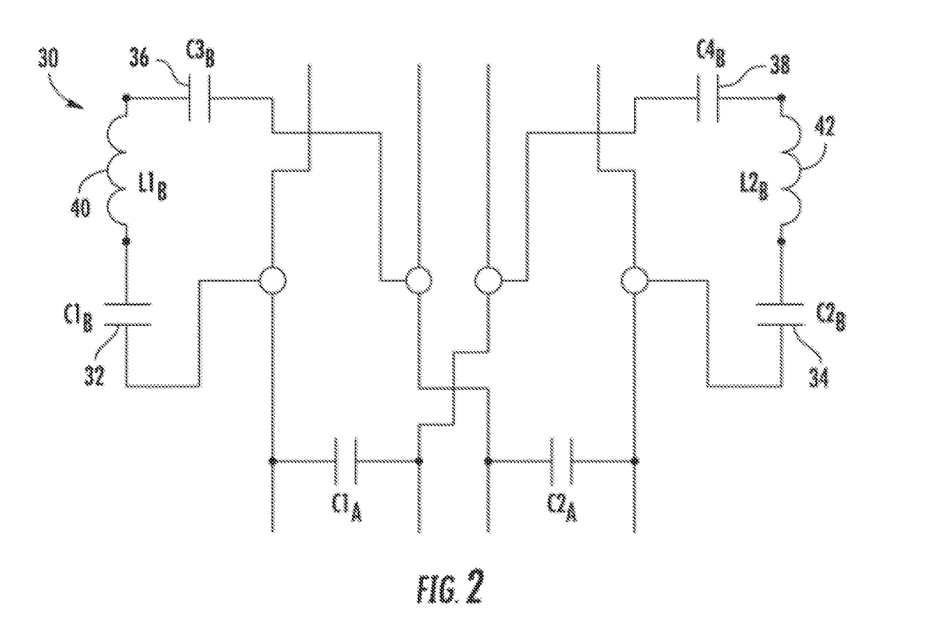
FIG. 2 is a schematic illustration of a shape-neutral capacitive compensation implementation without change in the shape of the transmission line. An additional inductive component between two compensating capacitors is for modifying the capacitive coupling effect achieved by the compensating capacitor as a function of frequency.

FIG. 2 shows a shape-neutral capacitive compensation implementation (30) without change in the shape of the transmission lines. The shape-neutral capacitive compensation implementation containing two large capacitance compensating capacitors, $C1_B$ (32) and $C2_B$ (34), that are not in direct contact with the transmission lines. An additional compensating capacitor, $C3_B$ (36), connected with $C1_B$ (32) in series, is applied between Pin 3 and Pin 5. Further, an additional compensating capacitor, $C4_B$ (38), connected with $C2_B$ (34) in series, is applied between Pin 4 and Pin 6. Both $C3_B$ (36) and $C4_B$ (38) are not large capacitance capacitors, and do not require the large physical structure containing the large capacitance compensating capacitors, $C1_B$ (32) and $C2_B$ (34), to be attached to Pair 3. Also, the large capacitance compensating capacitors, $C1_B$ (32) and $C2_B$ (34), are not in direct contact with Pair 3, and therefore do not alter the shape of the transmission lines or cause the impedance mismatch. In some embodiments, additional inductive components, $L1_B$ (40) and $L2_B$ (42), are located between $C1_B$ (32) and $C3_B$ (36), and between $C2_B$ (34) and $C4_B$ (38), respectively. The inductance of $L1_B$ (40) and $L2_B$ (42) are adjustable to modify the capacitive coupling effect achieved by the compensating capacitors as a function of frequency.

Figure 3:
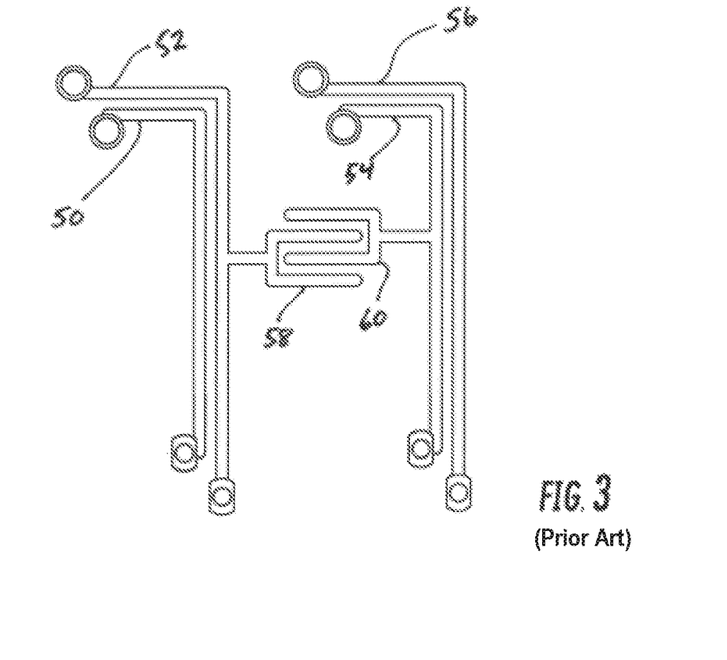
FIG. 3 is a schematic illustration of a standard method adding capacitors to PCB traces.
Figure 4:
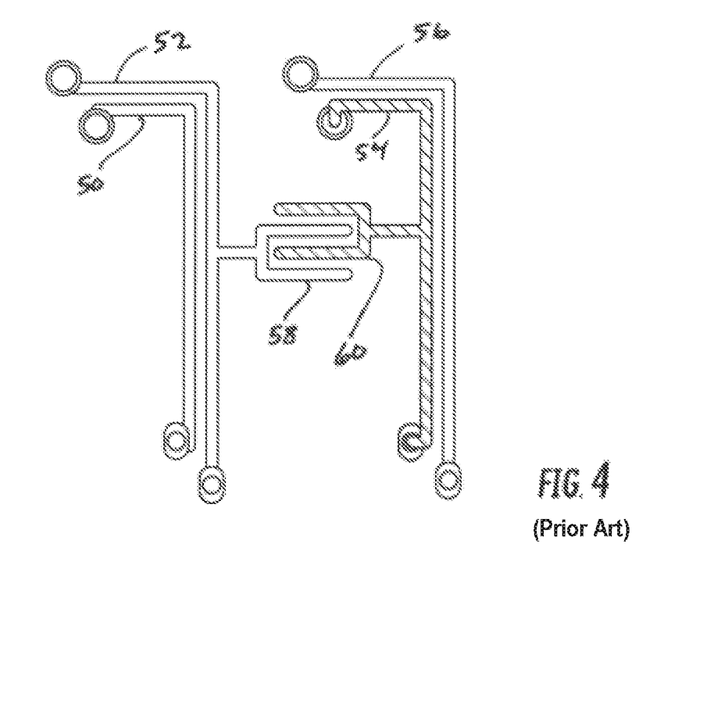
FIG. 4 is a schematic illustration of a standard method adding capacitors to PCB traces as shown in FIG. 3 by highlighting the change in the shape of the transmission lines.

FIG. 3 shows a standard implementation for adding capacitors to PCB traces. FIG. 4 shows the same standard method adding capacitors to the same PCB traces as shown in FIG. 3 by highlighting the change in the shape of the transmission lines. In FIG. 3, there are four transmission lines, (50, 52, 45, 56), of the exemplary PCB traces. Two transmission lines (50) and (52) are located on the left of the circuit board, while the other two transmission lines (54) and (56) are located on the right of the circuit board. Here, a PCB trace is running next to another PCB trace, causing the high frequency electrical to jump over to the capacitor, a phenomenon known as crosstalk. To reduce crosstalk, two compensating interdigital capacitors are used. A first interdigital capacitor (58) is connected to the transmission line (52) and located on its right; a second interdigital capacitor (60) is connected to the transmission line (54) and located on its left. Each interdigital capacitor has three fingers: one finger is connected to the transmission line, and the other two fingers are parallel to each other. Two interdigital capacitors (58) and (60) are positioned within the area surrounded by the transmission lines (52) and (54). One of the two parallel fingers of either interdigital capacitor is positioned into the space of the two parallel fingers of the other interdigital capacitor. As shown in FIG. 3 and, more particularly, FIG. 4 with highlighted interdigital capacitor (60) and transmission line (54), the addition of the capacitors makes the shape of the transmission lines very different from that without the additional capacitors. The shape of the PCB traces, specifically the width of each trace, as it runs from contact to contact dictates its impedance. Placing the compensating capacitors onto the transmission lines has the effect of creating a "stub" which changes the transmission line structure and thus its impedance. In some embodiments, this standard method adding capacitors to PCB traces can be achieved using overlapping plate capacitors with multiple layers.

Figure 5:
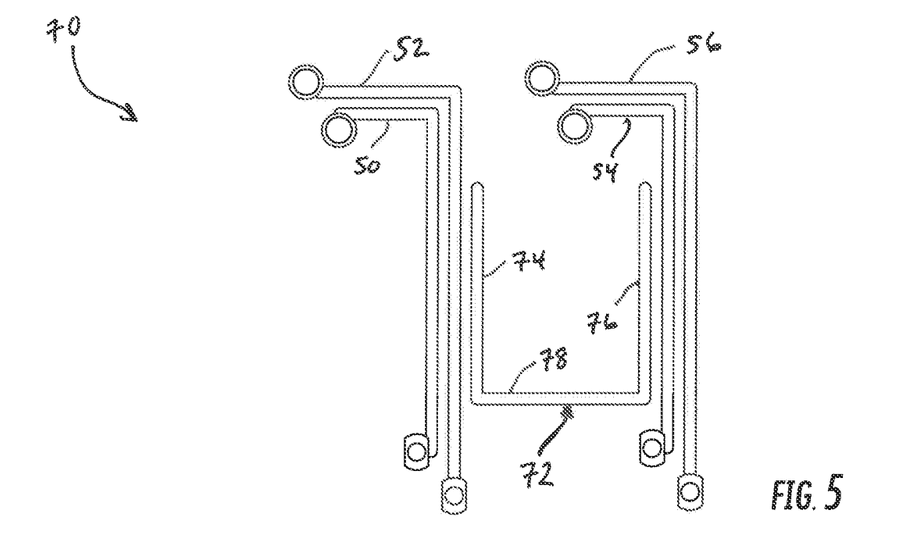
FIG. 5 is a schematic illustration of a shape-neutral method adding a capacitive compensating structure to PCB traces.
Figure 6:
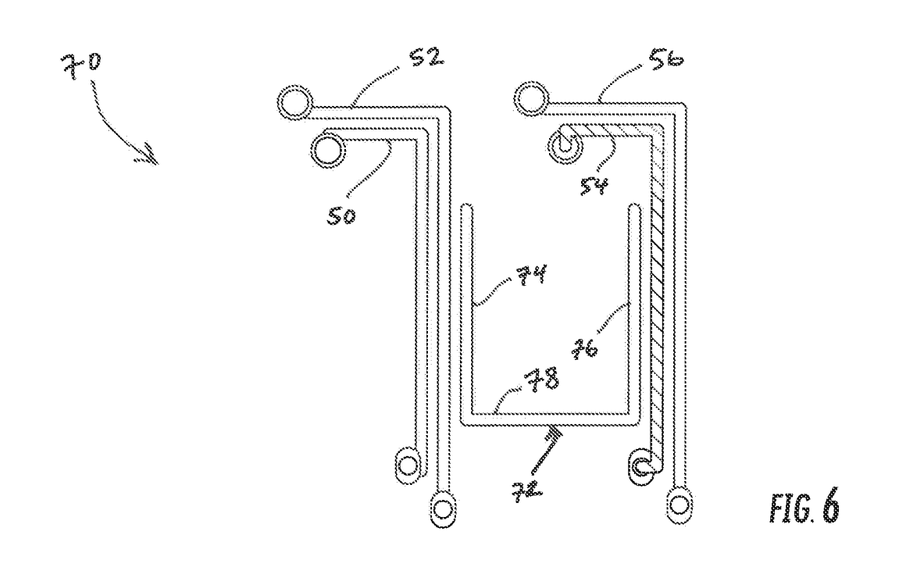
FIG. 6 is a schematic illustration of a shape-neutral method adding a capacitive compensating structure to PCB traces as shown in FIG. 5 by highlighting the unchanged shape of the transmission lines.
Figure 7:
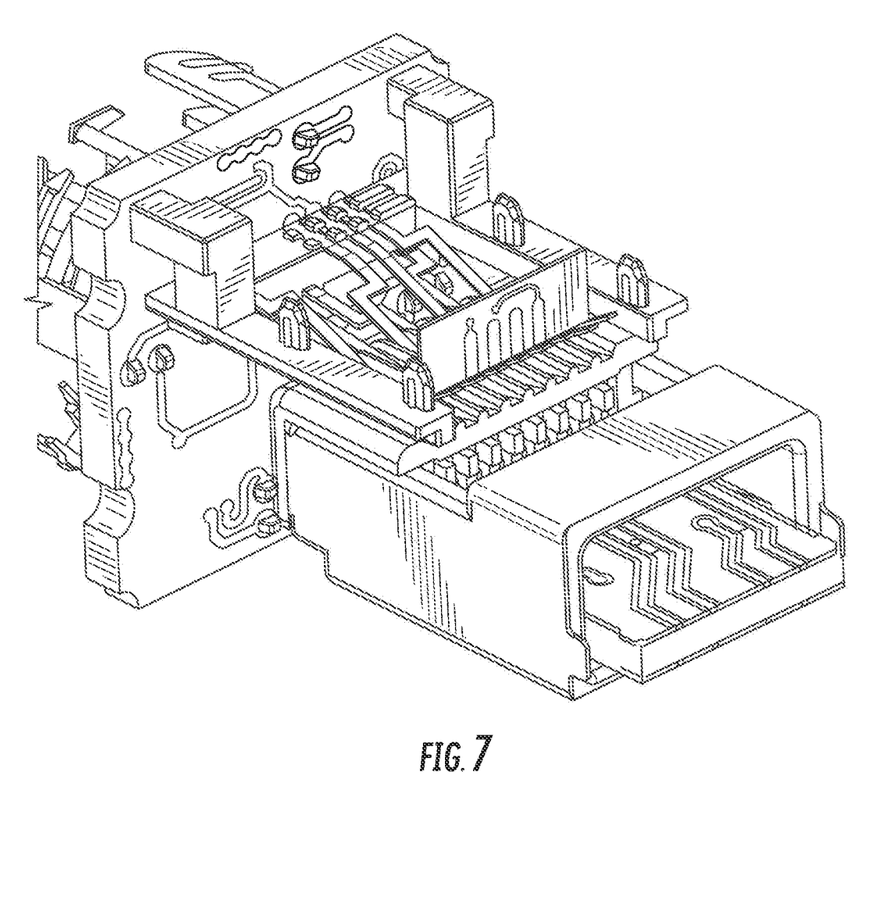
FIG. 7 is a perspective view of a jack and plug connection model including Pair 1 to Pair 3 compensating structure.

FIG. 5 shows a shape-neutral implementation (70) for adding a capacitive compensating structure to PCB traces. FIG. 6 shows the same shape-neutral implementation (70) adding a capacitive compensating structure to the same PCB traces as shown in FIG. 5 and including a highlighting of the unchanged shape of the transmission lines. Like in FIG. 3, there are four transmission lines (50, 52, 54, 56) of the exemplary PCB traces in FIG. 5. Two transmission lines (50) and (52) are located on the left of the circuit board, while the other two transmission lines (54) and (56) are located on the right of the circuit board. A U-shaped compensating structure (72) consisting of two compensating capacitors (74) and (76) and a series inductive component (78) located in between, is located in the area surrounded by the transmission lines (52) and (54). The U-shaped compensating structure (72) has no direct contact with any transmission line, but is positioned so that one side consisting of the compensating capacitor (74) is juxtaposed parallel to the transmission line (52), and the other side consisting of the compensating capacitor (76) is juxtaposed parallel to the transmission line (54). Since there is no contact between the U-shaped compensating structure (72) and the PCB traces, the U-shaped compensating structure (72) can be designed in many ways and positioned in many locations within the area. In one preferred embodiment, the U-shaped compensating structure (72) within an RJ-45 style connector is positioned in a location as electrically close to the offending capacitors of the plug as possible. This often leads to the U-shaped compensating structure (72) being placed within the area of the plug interface contacts on a flexible circuit. This U-shaped compensating structure (72) is also called a shape-neutral compensating structure which does not change the shape of the transmission lines, i.e. the PCB traces. FIG. 7 shows a perspective view of a partial jack and plug connection model including the plug interface contacts within which a Pair 1 to Pair 3 compensating structure is on a flexible circuit. Like the standard method discussed above, this shape-neutral compensating structure can be achieved using overlapping plate capacitors with multiple layers.

Figure 8:
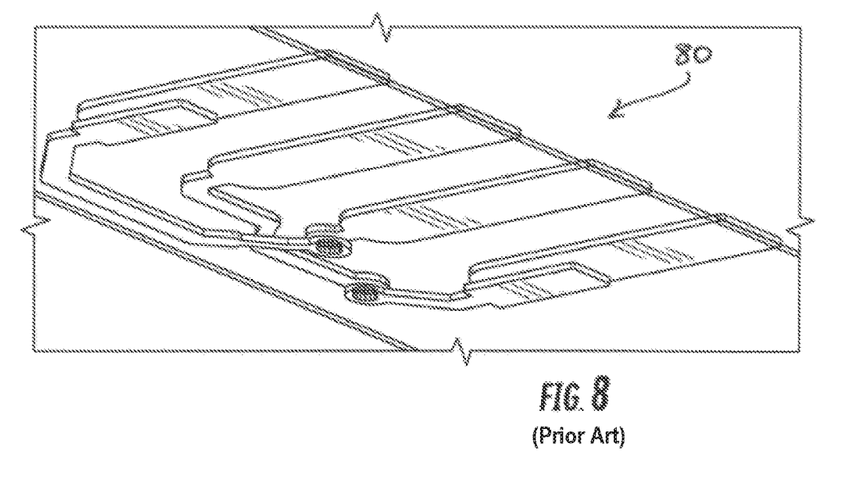
FIG. 8 is an isolated perspective view of a traditional style Pair 1 to Pair 3 capacitive compensating structure using plate capacitors.
Figure 9:
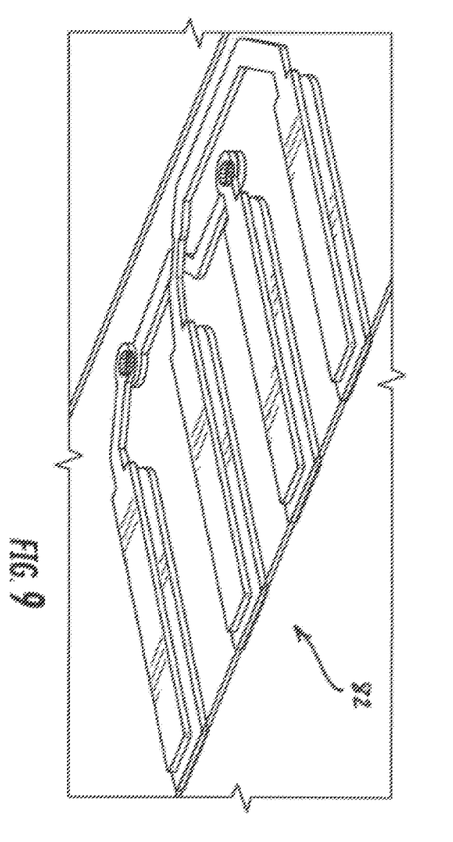
FIG. 9 is an isolated perspective view of a shape-neutral style Pair 1 to Pair 3 capacitive compensating structure using plate capacitors.

FIG. 8 shows a traditional style Pair 1 to Pair 3 capacitive compensating structure (80) using plate capacitors. FIG. 9 shows a shape-neutral style Pair 1 to Pair 3 capacitive compensating structure (82) using plate capacitors. In FIG. 8, there are four pads, Pad 1, Pad 2, Pad 3, and Pad 4. The lower level of Pad 1, Pad 2, Pad 3, and Pad 4 are connected to Pin 3, Pin 4, Pin 5 and Pin 6, respectively. Thus, the pair of Pin 4 and Pin 5 is the middle pair, Pair 1, and the pair of Pin 3 and Pin 6 is the splitting pair, Pair 3. In the traditional Pair 1 to Pair 3 capacitive compensating structure, the upper level of Pad 2 and Pad 3 are extended to be connected to Pin 4 and Pin 5, respectively. Compared to the upper level of Pad 1 and Pad 4, the extension of the upper level of Pad 2 and Pad 3 dramatically changes the shape of the pads, resulting in impedance mismatch. FIG. 9 also shows four pads, Pad 1, Pad 2, Pad 3, and Pad 4, the lower level of which are connected to Pin 3, Pin 4, Pin 5 and Pin 6, respectively. In the shape-neutral style Pair 1 to Pair 3 capacitive compensating structure, the upper level of any pad does not have to be connected to any pin. Accordingly, no extension of the upper level of any pad is required. The upper level of four pads has the same size and shape, and no impedance mismatch exists. In addition, there are two series inductive components that are located in the middle of the upper levels of Pad 1 and Pad 3, and in the middle of the upper levels of Pad 2 and Pad 4, respectively. These two series inductive components are adjustable to modify the capacitive coupling effect achieved by the compensating capacitors as a function of frequency.

Figure 10:
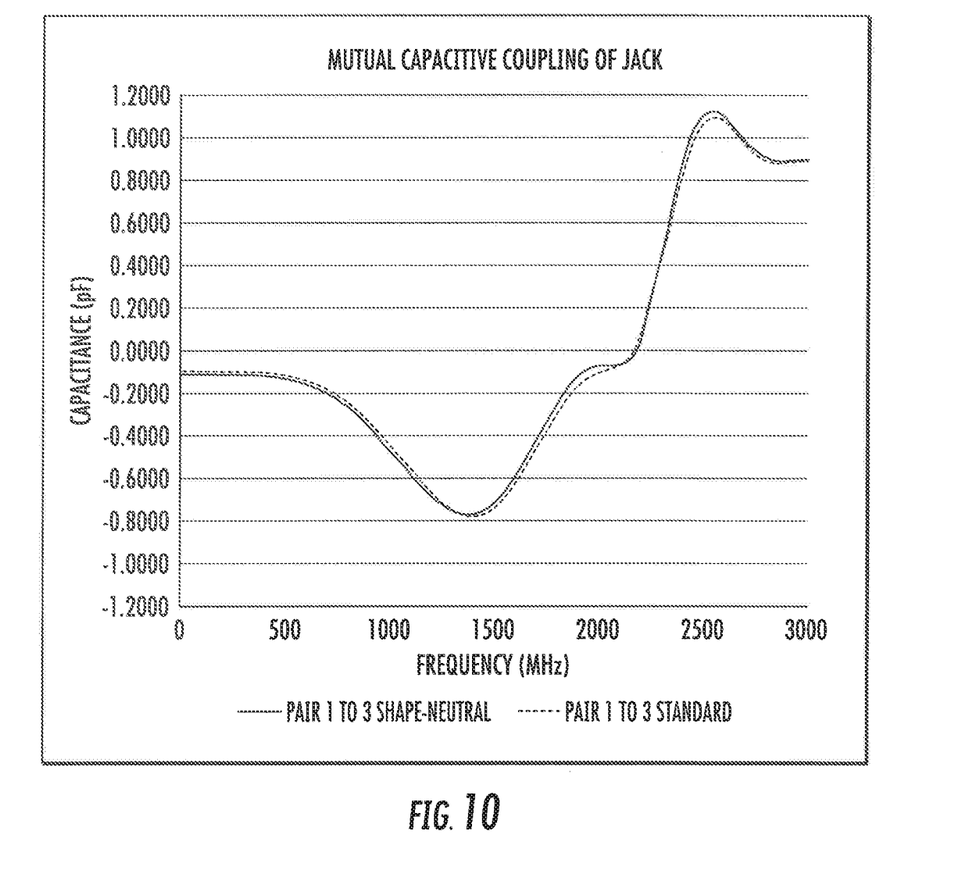
FIG. 10 shows the mutual capacitance as a function of frequency using the traditional style and the shape-neutral style Pair 1 to Pair 3 capacitive compensation mechanisms.
Figure 11:
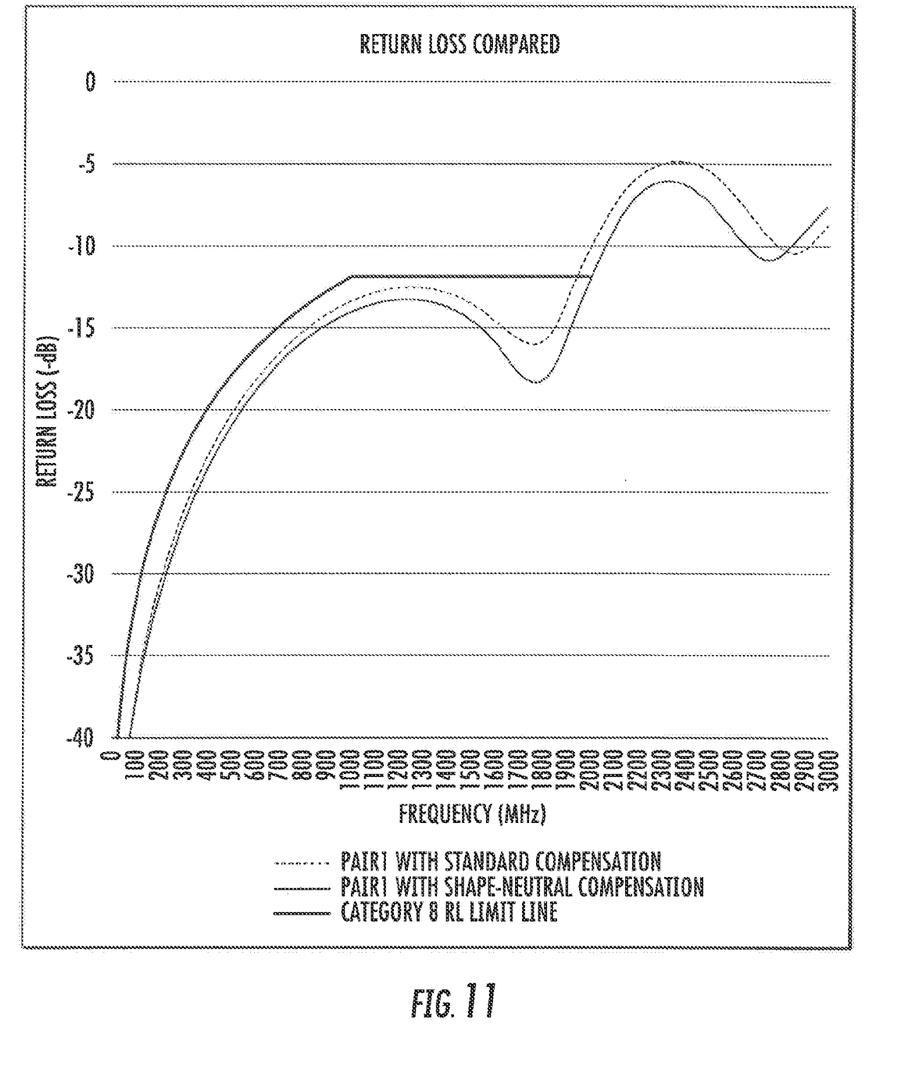
FIG. 11 shows the return loss as a function of frequency using the traditional style and the shape-neutral style Pair 1 to Pair 3 capacitive compensation mechanisms.

FIG. 10 shows the capacitive coupling effects using the traditional and the shape-neutral style Pair 1 to Pair 3 capacitive compensating structures as shown in FIG. 8 and FIG. 9. As seen from FIG. 10, the traditional and the shape-neutral style Pair 1 to Pair 3 capacitive compensating structures have the same capacitive coupling effects, showing no difference in the mutual capacitance as a function of frequency within the frequency range from 0 to 3000 MHz. FIG. 11 shows the return loss for Pair 1 using the traditional and the shape-neutral style Pair 1 to Pair 3 capacitive compensating structures as shown in FIG. 8 and FIG. 9. As seen from FIG. 11, the traditional and the shape-neutral style Pair 1 to Pair 3 capacitive compensating structures have the same return loss, showing no difference in the capacitance of Pair 1 that is a function of frequency, within the frequency range from 0 to 500 MHz. Starting from 500 MHz, the return loss for Pair 1 using the shape-neutral style Pair 1 to Pair 3 capacitive compensating structure becomes lower than that using the traditional style Pair 1 to Pair 3 capacitive compensating structure. With increasing frequency, the difference in the return loss for Pair 1 increases, up to a frequency of 1800 MHz. The return loss for Pair 1 using both traditional and shape-neutral style Pair 1 to Pair 3 capacitive compensating structures reaches an optimal value at the frequency of 1800 MHz, i.e. the lowest point within the studied frequency range from 0 to 3000 MHz. The return loss using both structures is within the Category 8 RL limit, up to 2000 MHz.

While the present invention has been shown and described in accordance with several preferred and practical embodiments, it is recognized that departures from the instant disclosure are contemplated within the spirit and scope of the present invention.

What is claimed is:
1. A system for reducing crosstalk and return loss within electrical communication connectors comprising:
    at least four of a plurality of pins, wherein a first pin and a second pin constitute a first pair and a third pin and a fourth pin constitute a second pair;
    at least two of a plurality of offending capacitors, wherein a first offending capacitor is applied between the first pin and the second pin and a second offending capacitor is applied between the third and the fourth pin;

at least four of a plurality of compensating capacitors, wherein a first compensating capacitor and a second compensating capacitor connected in series are applied between the first pin and the third pin and a third compensating capacitor and a fourth compensating capacitor connected in series are applied between the second pin and the fourth pin;

wherein at least one of the first compensating capacitor and the second compensating capacitor has no direct contact with any pins of the first and second pairs; and wherein at least one of the third compensating capacitor and the fourth compensating capacitor has no direct contact with any pins of the first and second pairs, wherein the at least four of a plurality of compensating capacitors form a shape-neutral structure.

2. The system as recited in claim 1, wherein at least one of a plurality of series inductive components is located between the first compensating capacitor and the second compensating capacitor.

3. A system for reducing crosstalk and return loss within electrical communication connectors comprising:

at least a shape-neutral structure containing at least one of a plurality of compensating capacitors which is close and parallel to a PCB trace, wherein said shape-neutral structure has no direct contact with the PCB trace;

said shape-neutral structure contains at least a first compensating capacitor and a second compensating capacitor connected in series;

said shape-neutral structure further comprising a plurality of plate capacitors; and said shape-neutral structure further comprising a flexible circuit.

4. The system as recited in claim 3, wherein said shape-neutral structure containing at least one of a plurality of inductive components that is located between the first compensating capacitor and the second compensating capacitor.

5. A system for reducing crosstalk and return loss within electrical communication connectors comprising:

at least four of a plurality of pins, wherein a first pin and a second pin constitute a first pair and a third pin and a fourth pin constitute a second pair;

at least four of a plurality of compensating plate capacitors, each having an upper pad and a lower pad, wherein the lower pad of each of the plurality of compensating plate capacitors is connected to one corresponding pin of said plurality of pins;

wherein the upper pad of each of said plurality of compensating plate capacitors has the same shape as and close in size to the lower pad of each of said plurality of compensating plate capacitors;

wherein the upper pad of each of said plurality of compensating plate capacitors has no connection to each corresponding pin; and wherein the first compensating plate capacitor is connected with the third compensating plate capacitor in series; the second compensating plate capacitor is connected with the fourth compensating plate capacitor in series, and wherein the at least four of a plurality of compensating capacitors form a shape-neutral structure.

6. The system as recited in claim 5, wherein at least one of a plurality of series inductive components is located between the first compensating plate capacitor and the third compensating plate capacitor.

* * * * *